(12) United States Patent
Endler et al.

(10) Patent No.: US 6,528,171 B1
(45) Date of Patent: Mar. 4, 2003

(54) TOOL WITH A MOLYBDENUM SULFIDE CONTAINING COATING AND METHOD FOR ITS PRODUCTION

(75) Inventors: Ingolf Endler, Coswig (DE); Albrecht Leonhardt, Dresden (DE); Udo König, Essen (DE); Hendrikus van den Berg, Venlo-Blerick (NL); Volkmar Sottke, Mülheim (DE)

(73) Assignee: Widia GmbH, Essen (DE)

( * ) Notice: Subject to any disclaimer, the term of this patent is extended or adjusted under 35 U.S.C. 154(b) by 0 days.

(21) Appl. No.: 09/890,174

(22) PCT Filed: Feb. 26, 2000

(86) PCT No.: PCT/DE00/00578
§ 371 (c)(1),
(2), (4) Date: Jul. 25, 2001

(87) PCT Pub. No.: WO00/52223
PCT Pub. Date: Sep. 8, 2000

(30) Foreign Application Priority Data

Mar. 3, 1999 (DE) .......................................... 199 09 372
Nov. 30, 1999 (DE) .......................................... 199 57 671

(51) Int. Cl.$^7$ ........................... B32B 15/02; C23C 16/00
(52) U.S. Cl. ...................... 428/469; 428/336; 428/472; 428/216; 428/255; 427/248.1; 407/119
(58) Field of Search ........................... 407/119; 51/307, 51/309, 295; 428/212, 216, 336, 697, 699, 704; 427/248.1

(56) References Cited

U.S. PATENT DOCUMENTS 6,284,366 B1 * 9/2001 Konig et al. ................. 428/336

FOREIGN PATENT DOCUMENTS

| DE | 31 52 742 | 10/1983 |
| DE | 44 14 051 | 7/1995 |
| DE | 195 11 829 | 10/1996 |
| EP | 580 019 | 1/1994 |
| EP | 0 852 167 | 7/1998 |
| WO | WO-97/04142 | 2/1997 |

* cited by examiner

*Primary Examiner*—Deborah Jones
*Assistant Examiner*—G. A. Blackwell-Rudasill
(74) *Attorney, Agent, or Firm*—Herbert Dubno

(57) ABSTRACT

The invention relates to a tool, especially a cutting insert for cutting metallic materials, which consist of a hard metal, cermet ceramics or steel base, especially of a high speed steel base, and at least one layer deposited thereon. The single layer, or in the case of several layers the outer layer or the layer underneath the outer layer, contains molybdenum sulfide. The aim of the invention is to improve the resistance to wear of the friction-reducing, molybdenum sulfide containing layer even at high pressures. To this end, the molybdenum sulfide containing layer consists of an alternating sequence of two layer that are different from one another. The first layer contains 51 to 100% by weight of metallic molybdenum and the second layer contains 21 to 100% by weight of $MoS_2$ which substantially consists of hexagonal crystals that are at least substantially oriented in a plane parallel to the tool surface.

11 Claims, No Drawings

TOOL WITH A MOLYBDENUM SULFIDE CONTAINING COATING AND METHOD FOR ITS PRODUCTION

CROSS REFERENCE TO RELATED APPLICATION

This application is a national stage of PCT/DE00/00578 filed Feb. 26, 2000 and based upon German national applications 199 09 372.5 of Mar. 3, 1999 and 199 57 671.8 of Nov. 30, 1999 under the International Convention.

FIELD OF THE INVENTION

The invention relates to a tool, especially a cutting insert for the machining of metallic workpieces, which is composed of a hard metal base body, a cermet base body, a ceramic base body or a steel base body, especially a high speed steel base body, and at least one layer deposited thereon of which the sole layer or, in the case of multiple layers, the outermost layer or a layer lying under the outermost layer contains molybdenum sulfide.

The invention relates further to a method of producing the molybdenum sulfide containing coating by means of CVD (chemical vapor deposition).

BACKGROUND OF THE INVENTION

The coating of substrate bodies of hard metal, a cermet, a ceramic or steel with hard materials or hard material mixtures or ceramic materials is known in the art. Especially used are carbides, nitrides, carbonitrides, oxycarbonitrides, oxides and/or borides of at least one of the elements of Groups IVa through VIa of the periodic system as, for example, TiC, TiN, Ti(C,N) or also ceramic materials like $Al_2O_3$ or $ZrO_2$. For large cutting cross sections and/or large chip cross sections high temperatures develop at the cutting edge of the machining tool especially with workpieces which are difficult to machine, thereby further increasing the wear and contributing in part to edge breakage.

To minimize the temperatures which arise in machining at the tool edge, so-called cooling lubricants are customarily used which, however, contain environmentally contaminating and toxic substances and which must be disposed of at high cost.

A further possibility, which can drastically reduce the use of coolant lubricant substances is the principle of so-called minimum quantity lubrication whereby very reduced amounts of coolant lubricant substances are supplied with point precision by fine passages to the contact locations between the tool edge and the workpiece. Apart from a high process technology and apparatus cost, these approaches do not eliminate the disposal problem but only minimize it.

On the other hand, so-called solid dry lubricant films are known in the state of the art, for example, molybdenum is disulfide which is known from DE-A-24 15 255 in which it is proposed to increase the adhesion to support surfaces by the so-called sputtering of an $MoS_2$ or $WS_2$ based layer with a thickness of 1–2 $\mu$m and then to apply a dry lubricant layer preferably of $MoS_2$ or $WS_2$ also on the base layer in a known manner by a polishing application.

In the East German Patent DD 202898 it has been proposed to coat cutting tools, stamping tools and machining tools with layers or the like of molybdenum disulfide by sputtering whereby the layer thickness is in the nm range. The hard material layer applied to a substrate body by sputtering should have a hexagonal lattice structure.

EP 0 534 905 A2 also proposes the PVD (plasma vapor deposition) coating of machining tools inter alia with molybdenum disulfide.

It has, however, been found that $MoS_2$ layers produced by cathode atomization (sputtering) adhere poorly to the substrate body or on the outermost hard material layer applied to the substrate body or have frequently an unsatisfactory orientation of the $MoS_2$ crystallites. To obtain reduced friction coefficients, the hexagonal components of the $MoS_2$ layer should be so oriented that the hexagonal base planes lie parallel to the surface. In this manner, the oxidation resistance of the layer is also improved.

In the DE 35 16 933 A1 it has been proposed to set the ratio of the water vapor partial pressure to the coating rate at $10^{-7}$ mbar/1.6 mgm$^{-2}$ s$^{-1}$, which in practice has been found to be obtainable only with high technical cost. Apart from the requirement customary for the PVD process for pure gas atmospheres, i.e. gas atmospheres which do not contain impurities, there is a further drawback of the PVD process in that a targeted particle stream is produced from the target source to the substrate, whereby the substrate must be rotated about three axes to produce a uniform coating.

Furthermore, WO 97/04142 describes a method for the uniform coating of $MoS_2$ and a metal or a metal compound like titanium or titanium nitride by use of two targets by means of a sputtering process.

While the $MoS_2$ is relatively soft and not especially wear resistant, $MoS_2$ coatings have a significant effect since in the use of such a single or outermost $MoS_2$ layer, while rapidly rubbed off at the contact location of the tool with the workpiece still noticeably reduces the friction force for a certain period because of a penetration of $MoS_2$ particles from the edge inward (entrainment).

In DE 44 14 051 C1, a low-friction layer composite for components of metal materials, to which class tools can also belong, is proposed in which a high frequency magnetron atomization results in a nanodispersion forming an intermediate layer of $Cr_3Si$ or of chromium to which an $MoS_x$ layer is applied by means of high frequency magnetron atomization.

U.S. Pat. No. 5,709,936 describes a coated substrate body which is comprised of a layer of a hard material phase and a solid lubricant phase. The proportion of the hard material phase should amount to 50 to 90 volume %. The solid lubricant phase should preferably be composed of molybdenum sulfide. The coating is applied by means of CVD, whereby the substrate body is heated to a temperature between 350° C. and 850° C. Then a gas mixture of $Ti((CH_3)_2N)_4$, $NH_3$, $MoF_6$ and $H_2S$ is admitted, whereby the two phase layer $TiN$-$MoS_2$ is formed.

In DE 38 34 356 A1, the deposition of thin molybdenum sulfide layers from a gas phase is described, the gas phase containing molybdenum hexacarbonyl, hydrogen sulfide and argon as carrier gas.

In the previously known CVD depositions, only relatively thin molybdenum sulfide layers can be produced in which the hexagonal crystallite planes lie parallel to the substrate surface and at the same time are dense. With longer layer growth periods, morphologies develop in which the hexagonal molybdenum crystallites are oriented perpendicularly to the substrate surface. With molybdenum sulfide layers of greater thickness, there is ready ablation of the layers which because of the poor space filling also are associated with a limited wear resistance.

OBJECT OF THE INVENTION

It is thus an object of the present invention to provide a friction reducing layer which contains molybdenum disulfide and has a high wear resistance even at high pressing forces like those which arise in machining.

SUMMARY OF THE INVENTION

This object is achieved with a tool in which the molybdenum sulfide containing layer is composed of an alternating sequence of two layers differing from one another and of which one has a 50 to 100 mass percent proportion of metallic molybdenum and the second a 20 to 100 mass % proportion of the molybdenum disulfide which is essentially composed of hexagonal crystallites which are oriented at least substantially plane parallel to the surface. Surprisingly, with such a lamella like layer composite, a significantly improved wear resistance can be obtained.

Thus the individual layers can contain phases comprised of molybdenum atoms and sulfur atoms in proportions up to 50 mass %, preferably up to 10 mass %. Preferably the layers are composed of phases which in x-ray defraction have molybdenum-characterizing reflections at (110) (200) and/or (211) and/or the molybdenum sulfide determined reflection (002).

According to a further feature of the invention, the respective concentration of the molybdenum component or the molybdenum sulfide component is not constant in the individual different layers but varies continuously between a maximum value and a minimum value in dependence upon the layer depth. This alternation runs through a plurality of layers periodically, i.e. within one layer consisting essentially of molybdenum, the molybdenum sulfide component increases in the direction of the next, predominantly molybdenum sulfide layer to a certain proportion and then decreasing inversely in the direction of the next following predominantly molybdenum layer.

In the boundary regions of the hexagonally crystallized molybdenum disulfide containing layers, small proportions of $MO_2S_3$ can be contained.

Preferably the layering closes with an outermost coating of metallic molybdenum.

The total thickness of the molybdenum containing layer lies in the range of 0.5 $\mu$m to 5 $\mu$m, preferably between 0.1 $\mu$m and 0.2 $\mu$m. The thicknesses of each of two successive layers amounts to 50 nm to 500 nm.

A corresponding arrangement is also applicable for layering which instead of molybdenum or molybdenum sulfide contains tungsten or tungsten sulfide.

In one embodiment of the present invention, apart from the aforedescribed layers, a hard material layer, preferably 2 to 4 $\mu$m in thickness, can be deposited directly on the substrate body and preferably is comprised of TiN.

To produce the molybdenum sulfide containing layers, preferably a CVD process is used. Initially an uncoated base body or optionally a base body coated with a hard material is heated in a nonreactive gas mixture of hydrogen and argon to a temperature between 500° C. and 900° C., preferably between 600° C. and 750° C. Then a pressure between 0.1 kPa and 50 kPa, preferably between 0.1 kPa and 1 kPa is established, after which a gas mixture of a molybdenum halogenide, especially molybdenum chloride, hydrogen and argon with a volume proportion of the molybdenum halogenide of 0.5 to 5%, preferably 0.5 to 2%, is fed into the process or passed over the body to deposit a layer which is composed essentially of metallic molybdenum. After the deposition of such a layer, the supply of molybdenum halogenide gases is shut off and a sulfur-containing gas, preferably $H_2S$, $H_2$ and argon in a gas mixture with a sulfur-containing gas volume proportion of 1% to 10%, preferably 1% to 3% is fed into the process or over the molybdenum layer, until the upper edge region of the previously molybdenum layer deposit is at least partly reactively transformed into hexagonal $MoS_2$. The previously described method step can be repeated corresponding to the number of deposited individual layers chosen until the desired total layer thickness is reached.

Preferably, the last layer deposited and thus the outermost layer is comprised of molybdenum.

Preferably $MoCl_5$ and/or $MoCl_3$ are used in the gas phase and instead of molybdenum chloride, tungsten chloride can be used.

In principle, other methods can be employed which are appropriate for the alternating deposition of metallic molybdenum and the directly following transformation of the molybdenum layer in a sulfur-containing gas.

SPECIFIC EXAMPLES

Below based upon examples, the invention is described in greater detail in comparison to the state of the art.

Lathe cutting plates of the basic shape CNMG120408 and a first chip shape geometry (-23), are provided according to Table 1, test number 3, with a 4 $\mu$m thick TiN layer and then, by means of the aforedescribed CVD process, with a molybdenum sulfide containing cover layer which is comprised of individual layers with varying molybdenum and sulfur concentrations. Each layer is characterized by a phase mixture whereby the concentrations of the molybdenum phase and the hexagonal molybdenum sulfide phase vary in opposite senses. In the upper part of the layer, the concentration of the hexagonal molybdenum sulfide is the greatest (preferably close to 100%) and in the lower part the molybdenum concentration is the greatest. This layer structure results from alternating deposition of metallic molybdenum and treatment in an $H_2S$ containing atmosphere.

Both process steps are carried out in a CVD hot-wall reactor at a temperature of 700° C. and a pressure of 0.5 kPA. For the molybdenum deposition, $MoCl_5$ is vaporized at a temperature of 100° C. in an argon stream and simultaneously hydrogen is admitted to the reactor. The gas mixture which is produced is comprised of 1.3 volume % $MoCl_5$, 25.7 volume % $H_2$ and 73 volume % Ar. After a deposition duration of 30 min, the $MoCl_5$ supply is interrupted and a treatment step with an $H_2S$ containing atmosphere is carried out. For the duration of 20 min, a gas composition of 2.1 volume % $H_2S$, 10.9 volume % $H_2$ and 87 volume % Ar is used. The molybdenum layer deposited in the first step is transformed into the hexagonal $MoS_2$ to a large proportion. As an intermediate step $Mo_2S_3$ also arises but transitions to the $MoS_2$ with longer use of the $H_2S$. Surprisingly it has been discovered that the resulting hexagonal $MoS_2$ has a strong base orientation which is connected with an intensive (002) reflection in the x-ray structure analysis. The hexagonal planes of the layer lattice come to lie parallel to the surface. An x-ray defractogram of this layer shows both $MoS_2$ as well as Mo lines.

The aforementioned process steps are repeated 4 times respectively, so that a layer system with a high proportion of hexagonal $MoS_2$ arises. The metallographic investigations which were then carried out showed a coating composed of $MoS_2$ and Mo layers whose total thickness was 1 $\mu$m but had respective thicknesses of the individual layers of about 125 nm. The coating which was produced adhered well to the support (substrate body) and had a microhardness of 180 $HVo_5$.

The aforedescribed process can be modified in numerous ways within the framework of the present invention. Firstly the ratio of the amounts of the two phases molybdenum and molybdenum sulfide can be varied through the respective ratios of the coating durations for the first and second steps. The thicknesses of the individual layers can be modified by the total durations of the two process steps and the overall thickness can be finally adjusted by the number of layers. By selection of the process parameters for the CVD coating, further influences on the coating composition and its characteristics like mechanical stability, hardness and friction coefficient can be taken into consideration.

In a further example (see Table 1, test no. 6), lathe cutting inserts of the basic type (CNMG120408) although with another chip forming geometry (−49) can be provided initially with a multilayer coating of the composition TiN—Ti(C,N)—TiN. Thereafter, namely for the additional application of the dry lubricant layer according to the invention, the process was carried out as in the example previously described, however, with the proportion of molybdenum chloride in the gas mixture increased to 2 volume % in the first process step and the duration of the two steps shortened respectively to 5 min each, but, however, repeated 20× so that a total 40 individual layers are produced. The thickness of the molybdenum sulfide containing coating thus produced amounted to about 1.8 μm. This coating had a homogeneous appearance. The individual layers had, however, thicknesses of 45 nm and could be observed only with a high amplification with a bevel grinding of 1:30. The hardness of the deposited coating amounted to about 200 HV 05. The coating had a blue-black color.

The lathe cutting plates described previously, which had the dry lubricant layer according to the invention, were subjected to comparative testing with respective lathe cutting plates without the outer dry lubricant and with lathe cutting plates which have a pure $MoS_2$ coating. The results of these comparative tests are to be seen from Table 1.

The wear reducing effect of the dry lubricant layer according to the invention was investigated by turning continuous cuts without the use of a coolant lubricant substance. The selected material to be machined was X5CrNi1810 (1.4301) with $R_m$=590 N/mm$^2$. Austenitic steel tends, because of its heat resistance and reduced thermal conductivity, to form adhesions and overcuts at all cutting speeds. It belongs to the class of difficult to machine workpieces which in current practice is practically exclusively machined with coolant lubricants.

The machining of these materials is therefore a good test for layers with antifriction properties. The lathe cutting plates which were coated only by PCVD with 4 μm thick TiN layers had at a cutting speed $v_c$=160 m/min with a cutting depth Ap=2.5 mm and a cutter feed F-0.315 mm/revolution, without the use of a coolant lubricant, a life of 8.4 min. Lathe cutting plates of the same geometry with a 3 μm thick TiN coating and a 1.5 μm thick $MoS_2$ coating applied thereon (with a hexagonal structure) yielded lives of 10.2 min. Lathe cutting plates which also had the same geometry and onto the 4 μm thick TiN coating an $MO/MoS_2$ multilayer coating according to the invention was applied, gave a life of 16 min under the same conditions.

In a corresponding manner, lathe cutting plates known from the state of the art with a multilayer coating of Tin—Ti(C,N)—TiN under the same cutting conditions as those previously given could achieve a life of 14 min. By contrast lathe cutting plates with an additional $MoS_2$ layer applied by CVD gave a life of 17.5 min and lathe cutting plates which had a TiN—Ti(C,N)—TiN—Mo/$MoS_2$ coating had useful lives of 26.4 min. All of the aforementioned tests were carried out to the end of the cutting capabilities of the cutting tool. The comparatively high lives of the cutting plates according to the invention (tests numbers 3 and 6) by comparison with cutting inserts coated in accordance with the state of the art, show the surprisingly good effect of the coating according to the invention.

TABLE 1

| Test No | CNMG120408 with SFG Hard Material Coating | Coating Thickness | Dry lubricant coating thickness | Life/Min |
|---|---|---|---|---|
| 1 | CNMG120408-23 TiN State of the Art | 4 μm | None | 8.4 |
| 2 | CNMG120408-23 TiN State of the Art | 3 μm | $MoS_2$ 1.5 μm | 10.2 |
| 3 | CNMG120408-23 TiN According to the Invention | 4 μm | 4 (Mo/$MoS_2$) 1 μm | 16 |
| 4 | CNMG120408-49 TiN-Ti (C,N) - TiN State of the Art | 6 μm | None | 14 |
| 5 | CNMG120408-49 TiN-Ti (C,N) - TiN State of the Art | 6 μm | $MoS_2$ 1.5 μm | 17.5 |
| 6 | CNMG120408-49 TiN-Ti (C,N) - TiN According to the Invention | 6 μm | 20x (Mo/$MoS_2$) 1.8 μm | 26.4 |

What is claimed is:

1. A tool in the form of a cutting insert for machining a metal workpiece consisting essentially of a base body composed of a material selected from the group which consists of hard metals, cermets, ceramics and steel, and a coating applied to said body and consisting of a single layer or multiple layers and where the single layer or a layer lying beneath the outermost layer is a molybdenum sulfide containing layer comprised of an alternating sequence of two mutually different but adjacent layers of which a first contains 50 to 100 mass % metallic molybdenum and has a thickness of 50 nm and a second contains a 20 to 100 mass % proportion of $MoS_2$ and a thickness of 50 nm to 500 nm and which is in the form of essentially hexagonal crystals which at least are oriented plane parallel to a tool surface in major part.

2. The tool according to claim 1 wherein said first and second layers contain phases comprised of molybdenum atoms and sulfur atoms in proportions up to 50 mass %.

3. The tool according to claim 1 wherein the first and second layers comprise phases which are characterized by x-ray defraction reflections (110), (200), (211) determined by molybdenum or reflection (002) determined by molybdenum sulfide.

4. The tool according to claim 1 wherein the concentrations of the molybdenum and molybdenum sulfide vary continuously in said sequence between a maximum value and a minimum value as a function of the layer depth and from layer to layer periodically.

5. The tool according to claim 1 wherein in boundary regions between layers of said sequence the hexagonally crystallized $MoS_2$ containing layers contain reduced proportions of $MO_2S_3$.

6. The tool according to claim 1 wherein the sequence is terminated with an outermost layer of molybdenum.

7. The tool according to claim 1 wherein the total thickness of the sequence amounts to 0.5 μm to 5 μm.

8. The tool according to claim 1 wherein the sequence is on 2 μm to 4 μm of TiN on said substrate.

9. A method of producing a coating by chemical vapor deposition for use as a tool, comprising the steps of:
  a) heating a base body composed of a material selected from the group which consists of hard metals, cermets, ceramics and steel and coated with TiN in a nonreactive gas mixture of hydrogen and argon to a temperature between 500° C. and 900° C.;
  b) establishing a pressure during the chemical vapor deposition of 0.1 kPa and 50 kPa around said body:
  c) passing a gas mixture over the head body or admitting a gas mixture to the head body for the chemical vapor deposition and wherein the gas mixture comprises a molybdenum halogenide in a volume proportion of 0.5 to 5%, hydrogen and argon to deposit by chemical vapor deposition a layer which is constituted essentially of metallic molybdenum;
  d) thereafter cutting off a supply of molybdenum halogenide and feeding to an atmosphere in the region of said layer a sulfur containing gas with a volume proportion of 1% to 10% together hydrogen and argon for a length of time to convert the molybdenum os said layer at an upper edge region into hexagonal $MoS_2$; and
  e) repeating steps a) to d) to build up a coating on said body with a predetermined number of layers.

10. The method defined in claim 9 wherein said molybdenum halogenide is supplied in the form of $MoCl_4$ and/or $MoCl_5$.

11. The method defined in claim 9 wherein said coating has an outermost layer of molybdenum.

* * * * *